(12) United States Patent
Cui et al.

(10) Patent No.: US 10,847,222 B1
(45) Date of Patent: Nov. 24, 2020

(54) TIMING CONTROL OF VOLTAGE SUPPLY DURING POLARITY TRANSITION

(71) Applicant: Micron Technology, Inc., Boise, ID (US)

(72) Inventors: Mingdong Cui, Folsom, CA (US); Nathan Joseph Sirocka, Loomis, CA (US); Byung Sick Moon, Plano, TX (US); Jeffrey Edward Koelling, Fairview, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/668,558

(22) Filed: Oct. 30, 2019

(51) Int. Cl.
  *G11C 13/00* (2006.01)
  *H03K 19/20* (2006.01)
(52) U.S. Cl.
  CPC ...... *G11C 13/0061* (2013.01); *G11C 13/0038* (2013.01); *H03K 19/20* (2013.01)
(58) Field of Classification Search
  CPC . G11C 13/0061; G11C 13/0038; H03K 19/20
  See application file for complete search history.

(56) References Cited

U.S. PATENT DOCUMENTS

| 10,447,248 B2* | 10/2019 | Kim | H03K 19/20 |
| 10,541,691 B1* | 1/2020 | Kossel | H03L 7/0812 |
| 10,665,316 B2* | 5/2020 | Nakaoka | G11C 29/81 |
| 2020/0106426 A1* | 4/2020 | Vadi | H03K 3/0372 |

FOREIGN PATENT DOCUMENTS

EP  3361274 A1 *  8/2018  ....... G01R 31/31727

\* cited by examiner

*Primary Examiner* — Fernando Hidalgo
(74) *Attorney, Agent, or Firm* — Greenberg Traurig

(57) ABSTRACT

A timing control circuit in an integrated circuit memory device. The circuit has an input line, a first output line and a second output line. The input line configured to receive a control signal for the timing control circuit to generate, a first selection input on the first output line and a second selection input on the second output line. In response to the control signal transitioning from a first state to a second state, the first selection input completes a first transition before the second selection input starts a second transition (e.g., for selection between 0V and −4.5V); and in response to the control signal transitioning from the second state to the first state, the second selection input completes a third transition before the first selection input starts fourth transition (e.g., for selection between 5V and 1.2V). The sequential transitions avoid simultaneous selection of 5V and −4.5V.

20 Claims, 5 Drawing Sheets

```
┌─────────────────────────────────────────────────────────────┐
│ Connect a control signal to an input line of a timing       │
│ control circuit having a first output line and a second     │
│ output line  161                                            │
└─────────────────────────────────────────────────────────────┘
                              │
                              ▼
┌─────────────────────────────────────────────────────────────┐
│ Generate, by the timing control circuit according to the    │
│ control signal, a first selection input on the first output │
│ line and a second selection input on the second output      │
│ line  163                                                   │
└─────────────────────────────────────────────────────────────┘
                              │
                              ▼
┌─────────────────────────────────────────────────────────────┐
│ Connect, by a positive voltage selector having an output    │
│ line and connected to the first output line of the timing   │
│ control circuit, the output line of the positive voltage    │
│ selector to a positive power supply voltage or a first      │
│ predetermined voltage, according to the first selection     │
│ input  165                                                  │
└─────────────────────────────────────────────────────────────┘
                              │
                              ▼
┌─────────────────────────────────────────────────────────────┐
│ Connect, by a negative voltage selector having an output    │
│ line and connected to the second output line of the timing  │
│ control circuit, the output line of the negative voltage    │
│ selector to a second predetermined voltage or a negative    │
│ power supply voltage according to the second selection      │
│ input  167                                                  │
└─────────────────────────────────────────────────────────────┘
                              │
                              ▼
┌─────────────────────────────────────────────────────────────┐
│ In response to the control signal transitioning from a      │
│ first state to a second state, the first selection input    │
│ completing a first transition before the second selection   │
│ input starts a second transition  169                       │
└─────────────────────────────────────────────────────────────┘
                              │
                              ▼
┌─────────────────────────────────────────────────────────────┐
│ In response to the control signal transitioning from the    │
│ second state to the first state, the second selection input │
│ completes a third transition before the first selection     │
│ input starts a fourth transition  171                       │
└─────────────────────────────────────────────────────────────┘
```

FIG. 7

TIMING CONTROL OF VOLTAGE SUPPLY DURING POLARITY TRANSITION

FIELD OF THE TECHNOLOGY

At least some embodiments disclosed herein relate to timing control of voltage supply during polarity transition in integrated circuit memory.

BACKGROUND

A memory integrated circuit can have one or more arrays of memory cells formed on an integrated circuit die of semiconducting material. A memory cell is a smallest unit of memory that can be individually used or operated upon to store data. In general, a memory cell can store one or more bits of data.

Different types of memory cells have been developed for memory integrated circuits, such as random access memory (RAM), read-only memory (ROM), dynamic random access memory (DRAM), static random access memory (SRAM), synchronous dynamic random access memory (SDRAM), phase change memory (PCM), magneto random access memory (MRAM), negative-or (NOR) flash memory, electrically erasable programmable read-only memory (EEPROM), flash memory, etc. Some integrated circuit memory cells are volatile and require power to maintain data stored in the cells. Examples of volatile memory include Dynamic Random-Access Memory (DRAM) and Static Random-Access Memory (SRAM).

Some integrated circuit memory cells are non-volatile and can retain stored data even when not powered. Examples of non-volatile memory include flash memory, Read-Only Memory (ROM), Programmable Read-Only Memory (PROM), Erasable Programmable Read-Only Memory (EPROM) and Electronically Erasable Programmable Read-Only Memory (EEPROM) memory, etc. Flash memory includes negative-and (NAND) type flash memory or a negative-or (NOR) type flash memory. A NAND memory cell is based on a NAND logic gate; and a NOR memory cell is based on a NOR logic gate.

Cross-point memory (e.g., 3D XPoint memory) uses an array of non-volatile memory cells. The memory cells in cross-point memory are transistor-less. Each of such memory cells can have a phase-change memory device and a select device that are stacked together as a column in an integrated circuit. Memory cells of such columns are connected in the integrated circuit via two layers of wires running in directions that are perpendicular to each other. One of the two layers is above the memory cells; and the other layer is below the memory element columns. Thus, each memory cell can be individually selected at a cross point of one wire on each of the two layers. Cross point memory devices are fast and non-volatile and can be used as a unified memory pool for processing and storage.

A non-volatile integrated circuit memory cell can be programmed to store data by applying one voltage or a pattern of voltage to the memory cell during a program/write operation. The program/write operation sets the memory cell in a state that corresponds to the data being programmed/stored into the memory cell. The data stored in the memory cell can be retrieved in a read operation by examining the state of the memory cell. The read operation determines the state of the memory cell by applying a voltage and determine whether the memory cell becomes conductive at a voltage corresponding to a pre-defined state.

BRIEF DESCRIPTION OF THE DRAWINGS

The embodiments are illustrated by way of example and not limitation in the figures of the accompanying drawings in which like references indicate similar elements.

FIG. 7 shows a method to generate voltages with timing of polarity transition controlled according to one embodiment.

DETAILED DESCRIPTION

At least some embodiments disclosed herein provide systems, methods and apparatus to control timing of voltage supply during polarity transition in integrated circuit memory.

In some implementations, cross point memory can use a memory cell that has a select device but no phase-change memory device. For example, the memory cell can be a single piece of alloy with variable threshold capability. The read/write operations of such a cell can be based on thresholding the cell while inhibiting other cells in subthreshold bias, in a way similar to the read/write operations for a memory cell having a select device and a phase-change memory device that are stacked together as a column.

Such a memory cell, having a select device but no phase-change memory device, can be programmed in cross point memory to have a threshold voltage window. The threshold voltage window can be created by applying programming pulses with opposite polarity to the select device. For example, the select device can be biased to have a positive voltage difference between two sides of the select device and alternatively, to have a negative voltage difference between the same two sides of the select device. When the positive voltage difference is considered in positive polarity, the negative voltage difference is considered in negative polarity that is opposite to the positive polarity. Reading can be performed with a given/fixed polarity. When programmed, the memory cell has a threshold lower than the cell that has been reset, such that during a read operation, the read voltage can cause a programmed cell to become conductive while a reset cell remains non-conductive.

A voltage driver can be controlled by signals of various voltages to drive programming pulses with opposite polarity. The voltage driver can be configured to drive a selection voltage in response to a control signal of a first voltage, and a selection voltage in opposite polarity in response to a control signal of a second voltage. Similarly, the voltage driver can be configured to drive a de-selection voltage in response to a control signal of a third voltage, and a de-selection voltage in opposite polarity in response to a control signal of a fourth voltage. The voltage range among the first, second, third and fourth voltages for the control signals can be as high as 9V.

A loop-level shifter can be used to control the precise timing of supplying voltages to MOSFET (Metal-Oxide-Semiconductor Field-Effect Transistor) devices that are used to implement decoders and/or voltage drivers such that none of the MOSFET devices is subjected to more than 5.5V between any two terminals during a polarity transition between 5V and −4.5V.

Figure 1:
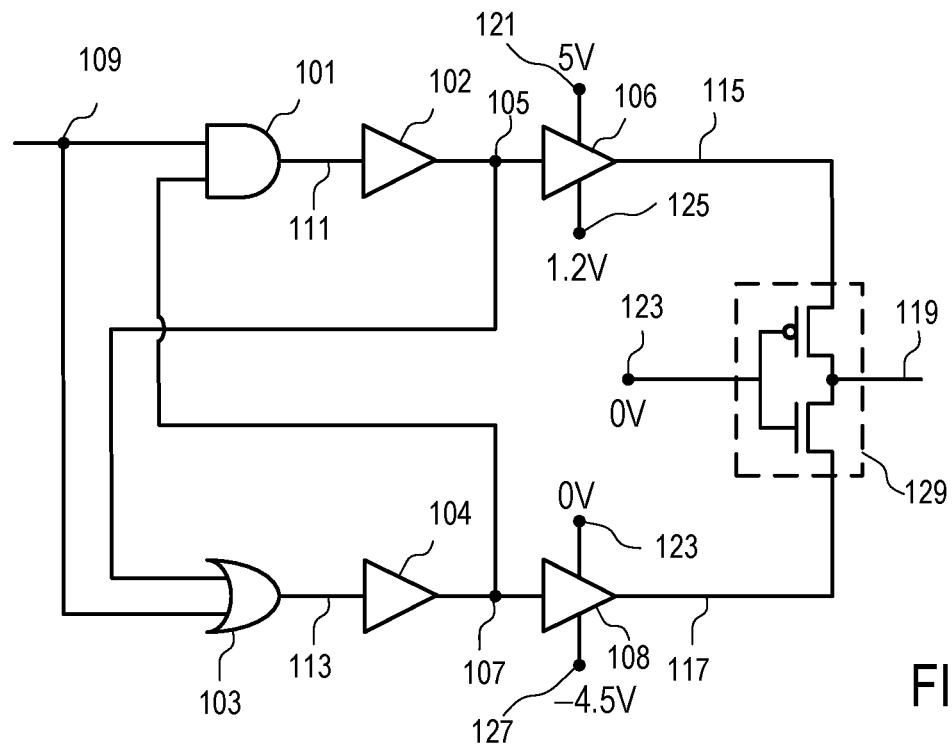
FIG. 1 shows a timing control circuit that avoids excessive voltages across MOSFET devices during polarity transition according to one embodiment.

FIG. 1 shows a timing control circuit that avoids excessive voltages across MOSFET devices during polarity transition according to one embodiment.

The timing control circuit of FIG. 1 includes an input line (109) and an output line (119).

The input line (109) is configured to receive a control signal indicating the desired polarity transition. In response to the transitioning of the control signal from having a logic state of "1" to a logic state of "0", the voltage on the output line (119) transitions from a positive high voltage to a negative high voltage. In response to the transitioning of the control signal having a logic state of "0" to a logic state of "1", the voltage on the output line (119) transitions from the negative high voltage to the positive high voltage. The logic state of "1" corresponds to the logic value of "True"; and the logic state of "0" corresponds to logic value of "False".

For example, the positive high voltage can be a positive power supply voltage (VPP) of 5V; and the negative high voltage can be a negative power supply voltage (VNN) of −4.5V.

The timing control circuit of FIG. 1 includes an AND gate (101) and an OR gate (103). The timing of voltage transitions in the circuit of FIG. 1 is controlled via feedback loops to the AND gate (101) and the OR gate (103). Specifically, the output (111) of the AND gate (101) is delayed (102) to generate an input (105) for the OR gate (103); and the output (113) of the OR gate (103) is delayed (104) to generate an input (107) for the AND gate (101).

The timing control circuit of FIG. 1 includes a positive voltage selector (106) and a negative voltage selector (108).

The positive voltage selector (106) is configured to selectively connect its output (115) to one of a positive high voltage (121) (e.g., VPP of 5V) and a predetermined voltage (125) (e.g., VCC of 1.2V). When the input (105) has the logic state of "1", the positive voltage selector (106) connects its output (115) to the positive high voltage (121) (e.g., VPP of 5V). When the input (105) has the logic state of "0", the positive voltage selector (106) connects its output (115) to the predetermined voltage (125) (e.g., VCC of 1.2V).

Similarly, the negative voltage selector (108) is configured to selectively connect its output (117) to one of a predetermined voltage (123) (e.g., VSS or ground of 0V) and a negative high voltage (127) (e.g., VNN of −4.5V). When the input (107) has the logic state of "1", the negative voltage selector (108) connects its output (117) to the predetermined voltage (123) (e.g., VSS or ground of 0V). When the input (105) has the logic state of "0", the negative voltage selector (106) connects its output (117) to the negative high voltage (127) (e.g., VNN of −4.5).

The feedback loop from the output (111) of the AND gate (101) to the input of the OR gate (103) causes the transition from "1" to "0" at the input (107) to occur at a time period after the completion of the transition from "1" to "0" at the input (105); and the feedback loop from the output (111) of the OR gate (103) to the input of the AND gate (101) causes the transition from "0" to "1" at the input (105) to occur at a time period after the completion of the transition from "0" to "1" at the input (107). Therefore, the output (115) is configured to transition from the positive high voltage (121) (e.g., VPP of 5V) to the predetermined voltage (125) (e.g., VCC of 1.2V) before the output (117) transitions from the predetermined voltage (123) (e.g., VSS or ground of 0V) to the negative high voltage (127) (e.g., VNN of −4.5V). Similarly, the output (117) transitions from the negative high voltage (127) (e.g., VNN of −4.5V) to the predetermined voltage (123) (e.g., VSS or ground of 0V), before the output (115) transitions from the predetermined voltage (125) (e.g., VCC of 1.2V) to the positive high voltage (121) (e.g., VPP of 5V). The timing arrangement avoids the simultaneous application of the positive high voltage (121) (e.g., VPP of 5V) and the negative high voltage (127) (e.g., VNN of −4.5V) to the outputs (115 and 117) respectively.

Figure 2:
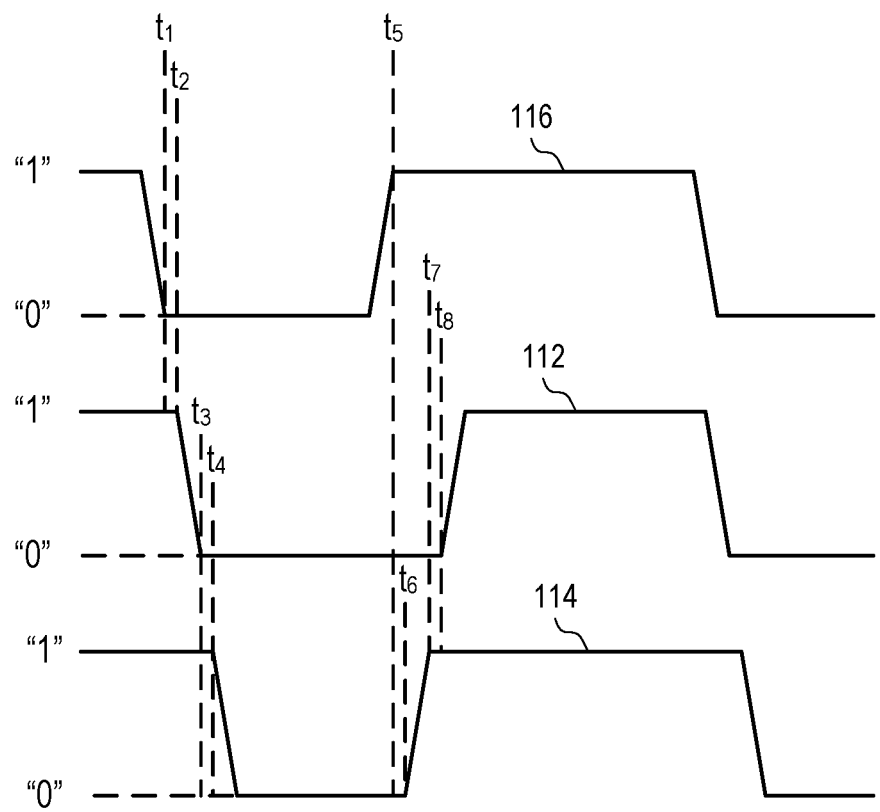
FIG. 2 shows timing of signal transitions in the circuit of FIG. 1.

FIG. 2 shows timing of signal transitions in the circuit of FIG. 1. In FIG. 2, the waveform (116) shows the signal transitions in the input line (109); the waveform (112) shows the signal transitions in the input (105) from the delay (102); and the waveform (114) shows the signal transitions in the input (107) from the delay (104).

In FIG. 1, when the input line (109) as the logic state of "1" and the circuit reaches a steady state, the output (113) of the OR gate (103) has the logic state of "1", which is delayed to generate the input (107) of "1" for the AND gate (101). Since both the input line (109) and the input (107) have the logic state of "1", the output (111) of the AND gate (101) has the logic state of "1", which is delayed to generate the input (105) of "1" for the OR gate (101). The input (105) of "1" for the OR gate (101) also causes the OR gate (101) to maintain its output (113) of "1".

When the input line (109) transitions from the logic state of "1" to reach the logic state of "0" at time t1 in the waveform (116) of FIG. 2, the output (111) of the AND gate (101) transitions from "1" to "0". After the delay (102), the input (105) transitions from "1" at time t2 to "0" at time t3 in the waveform (112) of FIG. 2. Only after the transition of the output (105) from "1" to "0", the output (113) of the OR gate (103) can transition from "1" to "0". After the delay (104), the input (107) transitions from "1" at time t4 to "0" in the waveform (114) of FIG. 2. Thus, the input (107) starts at time t4 to transition from "1" to "0" after the input (105) completes at time t3 its transition from "1" to "0". In response, the positive voltage selector (106) starts to disconnect its output (115) from the positive high voltage (121) (e.g., VPP of 5V) and connects its output (115) to the predetermined voltage (125) (e.g., VCC of 1.2V), before the negative voltage selector (108) starts to connect its output (117) to the negative high voltage (127) (e.g., VNN of −4.5V).

Similarly, When the input line (109) transitions from the logic state of "0" to reach the logic state of "1" at time t5 in the waveform (116) of FIG. 2, the output (113) of the OR gate (103) transitions from "0" to "1". After the delay (104), the input (107) transitions from "0" at time t6 to "1" at time t7 in the waveform (114) of FIG. 2. Only after the transition of the output (107) from "0" to "1", the output (111) of the AND gate (101) can transition from "0" to "1". After the delay (102), the input (105) transitions from "0" at time t8 to "1" in the waveform (112) of FIG. 2. Thus, the input (105) starts at time t8 to transition from "0" to "1" after the input (107) completes at time t7 its transition from "0" to "1". In response, the negative voltage selector (108) starts to disconnect its output (117) from the negative high voltage (127) (e.g., VNN of −4.5V) and connects its output (117) to the predetermined voltage (123) (e.g., VSS or ground of 0V), before positive the voltage selector (106) starts to connect its output (115) to the positive high voltage (121) (e.g., VPP of 5V).

In FIG. 1, a voltage selector (129) is configured to selectively connect its output (119) to the outputs (115 and 117) of the voltage selectors (106 and 108). The voltage selector (129) is controlled by a predetermined voltage (123) (e.g., VSS or ground at 0V).

When the positive voltage selector (106) connects its output (115) to the positive high voltage (121) (e.g., VPP of 5V) and the negative voltage selector (108) connects its output (117) to the predetermined voltage (123) (e.g., VSS or ground at 0V), the predetermined voltage (123) (e.g. VSS or ground at 0V) is relatively low, which causes the voltage selector (129) to connect its output (119) to the output (115) of the positive voltage selector (106) at the positive high voltage (121) (e.g., VPP of 5V).

When the positive voltage selector (106) connects its output (115) to the predetermined voltage (125) (e.g., VCC of 1.2V) and the negative voltage selector (108) connects its output (117) to the negative high voltage (127) (e.g., VNN at −4.5V), the predetermined voltage (123) (e.g. VSS or ground at 0V) is relatively high, which causes the voltage selector (129) to connect its output (119) to the output (117) of the negative voltage selector (108) at the negative high voltage (127) (e.g., VNN of −4.5V).

The voltage selectors (106 and 108) can be implemented as level shifters, buffers, or in a way similar to the implementation of the voltage selector (129).

Further, the delays (102 and 104) can be implemented in a way similar to the implementations of the voltage selectors (106 and 108), such that when the input line (109) transitions from "1" to "0", the voltage selector (106) connects its output (115) to the predetermined voltage (125) (e.g., VCC at 1.2V), before the negative voltage selector (108) connects its output (117) to the negative high voltage (127) (e.g., VNN of −4.5V). Similarly, when the input line (109) transitions from "0" to "1", the negative voltage selector (108) connects its output (117) to the predetermined voltage (123) (e.g., VSS or ground of 0V), before the voltage selector (106) connects its output (115) to the positive high voltage (121) (e.g., VNN at 5V).

Figure 3:
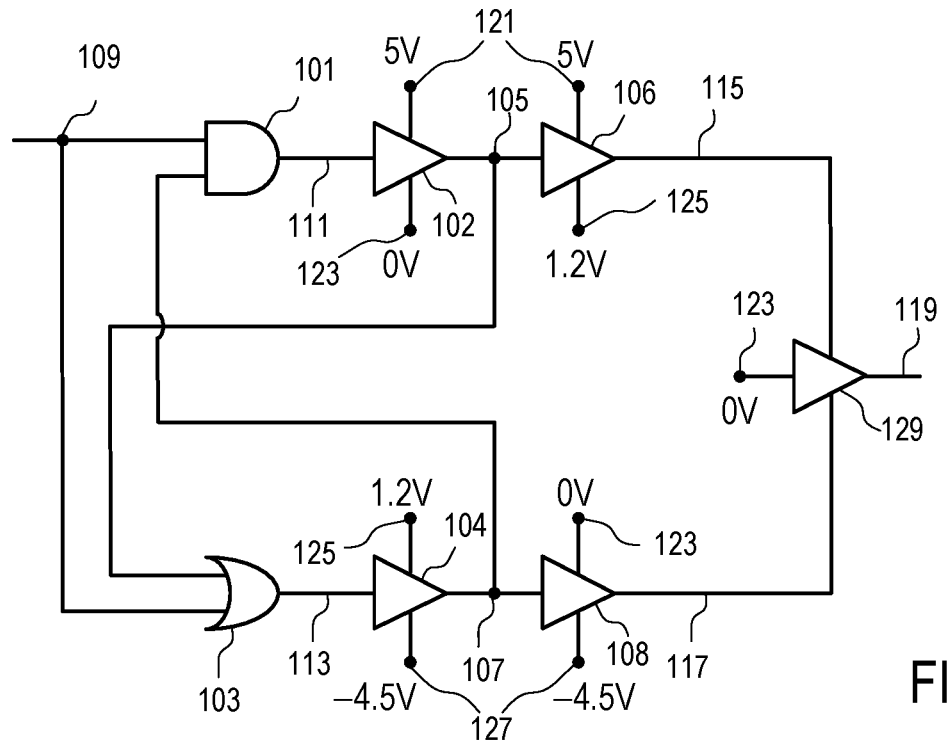
FIG. 3 shows an example of a timing control circuit that avoids excessive voltages across MOSFET devices during polarity transition according to one embodiment.

FIG. 3 shows an example of a timing control circuit that avoids excessive voltages across MOSFET devices during polarity transition according to one embodiment.

In the timing control circuit of FIG. 3, the voltage selectors (102 and 104) are used to generate (e.g., through level shifting) delayed versions of the outputs (111 and 113) of the AND gate (101) and the OR gate (103). In one embodiment, the voltage selectors (102 and 104) are implemented using level shifters; the voltage selectors (106 and 108) are implemented using buffers; and the voltage selector (129) is implemented using an inverter. A level shifter is slower than a buffer in response time.

The voltage selector (102) of FIG. 3 is configured to selectively connect its outputs to one of the positive high voltage (121) (e.g., VPP of 5V) and a predetermined voltage (123) (e.g., VSS or ground of 0V). In a way similar to the positive voltage selector (106), when the output (111) of the AND gate (101) has the logic state of "1", the voltages selector (102) connects its output (105) to the positive high voltage (121) (e.g., VPP of 5V). When the output (111) of the AND gate (101) has state of "0", the voltage selector (102) connects its output (105) to the predetermined voltage (123) (e.g., VSS or ground of 0V).

Similarly, the voltage selector (104) of FIG. 3 is configured to selectively connect its outputs to one of a predetermined voltage (125) (e.g., VCC of 1.2V) and the negative high voltage (127) (e.g., VNN of −4.5V). In a way similar to the negative voltage selector (108), when the output (113) of the OR gate (103) has the logic state of "1", the voltages selector (104) connects its output (107) to the predetermined voltage (125) (e.g., VCC of 1.2V). When the output (113) of the OR gate (103) has state of "0", the voltage selector (104) connects its output (107) to the negative high voltage (127) (e.g., VNN of −4.5V).

Since the switching delays in the voltage selectors (102 and 104) are substantially equal to the switching delays in the voltage selectors (106 and 108), the delays implemented via the voltage selectors (102 and 104) ensure that the voltage selector (106) connects its output (115) to the predetermined voltage (125) (e.g., VCC at 1.2V) before the voltage selector (108) starts to connect its output (117) to the negative high voltage (127) (e.g., VNN at −4.5V), when the input line (109) transitions from "1" to "0". Similarly, when the input line transitions from "0" to "1", the voltage selector (108) connects its output (117) to the predetermined voltage (123) (e.g., VSS or ground at 0V) before the voltage selector (106) starts to connect its output (115) to the positive high voltage (121) (e.g., VPP at 5V).

Thus, the voltage difference between the outputs (115 and 117) of the voltage selectors (106 and 108) is no more than 5.5V in all transitions.

The circuits of FIGS. 1 and 3 have the capability to transition between positive polarity and negative polarity. When the input line (109) has the logic state of "1" to request positive polarity, the outputs (115, 117 and 119) provide voltages of 5V, 0V, and 5V. When the input line (1090 has the logic state of "0" to request negative polarity, the outputs (115, 117 and 119) provide voltages of 1.2V, −4.5V, and −4.5V. The circuits of FIGS. 1 and 3 can transition between positive polarity and negative polarity without applying excessive voltages (e.g., above 5.5V) across any of the MOSFET devices in the circuits.

Figure 4:
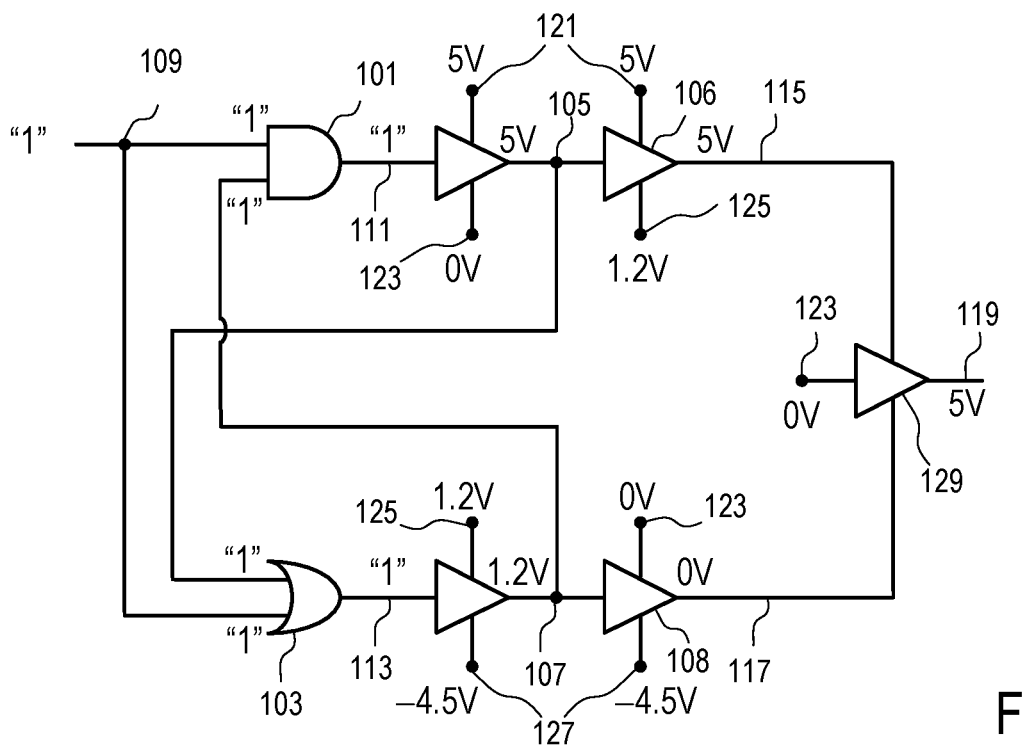
FIGS. 4-5 show steady state voltages in the circuit of FIG. 3.
Figure 5:
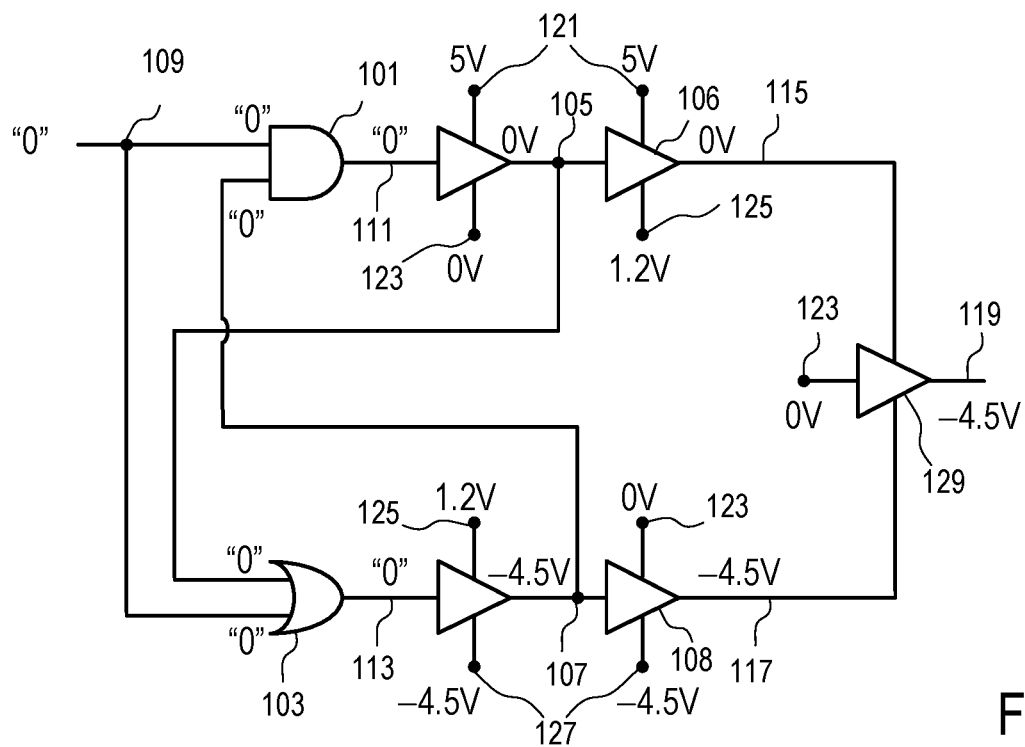

FIGS. 4-5 show steady state voltages in the circuit of FIG. 3.

In FIG. 4, the input line (109) has the logic state of "1". As a result, the AND gate (101) and the OR gate (103) output "1"; the input (105) has a high voltage of 5V corresponding to a logic state of "1" for the OR gate (103) and the positive voltage selector (1046; the input (107) has a high voltage of 1.2V corresponding to a logic state of "1" for the AND gate (101) and for the negative voltage selector (108); the outputs (115 and 117) of the voltage selectors (106 and 108) are 5V and 0V respectively; and the output (119) is connected via the voltage selectors (129 and 106) to the positive high voltage of 5V.

In FIG. 5, the input line (109) has the logic state of "0". As a result, the AND gate (101) and the OR gate (103) output "0"; the input (105) has a low voltage of 0V corresponding to a logic state of "0" for the OR gate (103) and the positive voltage selector (106); the input (107) has a low voltage of −4.5V corresponding to a logic state of "0" for the AND gate (101) and for the negative voltage selector (108); the outputs (115 and 117) of the voltage selectors (106 and 108) are 0V and −4.5V respectively; and the output (119) is connected via the voltage selectors (129 and 106) to the positive high voltage of 5V.

Figure 6:
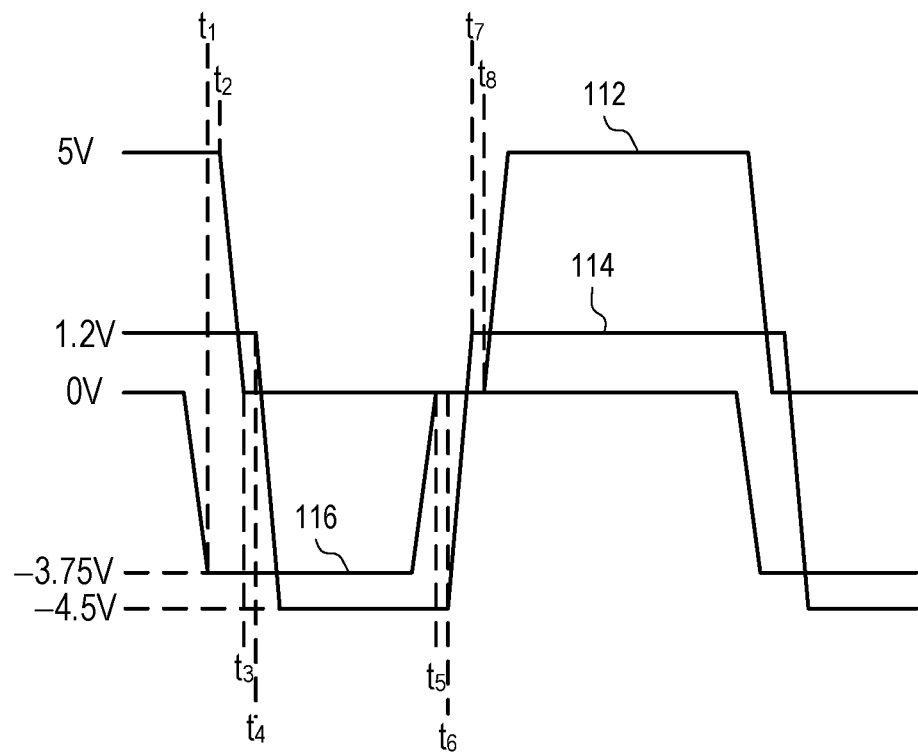
FIG. 6 shows timing of voltages in the circuit of FIG. 3.

FIG. 6 shows timing of voltages in the circuit of FIG. 3.

In FIG. 6, the waveform (116) shows the voltage transitions between 0V and −3.75V in the input line (109); the waveform (112) shows the voltage transitions between 5V and 0V in the input (105) generated by the voltage selector (102) of FIG. 3; and the waveform (114) shows the voltage transitions between 1.2V and −4.5V in the input (107) generated by the voltage selector (104) of FIG. 3.

In FIG. 6, the waveform (116) of the input (107) starts at time t4 to transition from 1.2V towards −4.5V, after the waveform (112) of the input (105) completes at time t3 of transitioning to 0V from 5V. Similarly, the waveform (112) of the input (105) starts at time t8 to transition from 0V towards 5V, after the waveform (114) of the input (107) completes at time t7 of transitioning to 1.2V from −4.5V.

FIG. 7 shows a method to generate voltages with timing of polarity transition controlled according to one embodiment. For example, the method of FIG. 7 can be implemented using the circuits of FIG. 1 or 3.

At block 161, a control signal (e.g., waveform 116 of FIG. 2 or 3) is connected to an input line (109) of a timing control circuit (e.g., illustrated in FIG. 1 or 3) having a first output line (105) and a second output line (107).

At block 163, the timing control circuit (e.g., illustrated in FIG. 1 or 3) generates according to the control signal (116) received on the input line (109), a first selection input (e.g., waveform 112 of FIG. 2 or 3) on the first output line (105) and a second selection input (e.g., waveform 114 of FIG. 2 or 3) on the second output line (107).

At block 165, a positive voltage selector (106), having an output line (115) and connected to the first output line (105) of the timing control circuit, connects the output line (115) of the positive voltage selector (106) to a positive power supply voltage (121) or a first predetermined voltage (125), according to the first selection input (112) provided on the first output line (105) of the timing control circuit.

At block 167, a negative voltage selector (108), having an output line (117) and connected to the second output line (107) of the timing control circuit, connects the output line (117) of the negative voltage selector (108) to a second predetermined voltage (123) or a negative power supply voltage (127) according to the second selection input (114) provided on the second output line (107) of the timing control circuit.

At block 169, in response to the control signal (116) on the input line (109) transitioning from a first state (e.g., "1") to a second state (e.g., "0"), the first selection input (112) provided on the first output line (105) completes a first transition (e.g., t2 to t3 in waveform 112 of FIG. 2 or 3) before the second selection input (114) provided on the second output line (107) starts a second transition (e.g., t4 in waveform 114 of FIG. 2 or 3).

For example, in response to the control signal (116) transitioning from the first state (e.g., "1") to the second state (e.g., "0"), the first transition (e.g., between t2 and t3 in waveform 112 of FIG. 2 or 3) in the first selection input (112) causes the positive voltage selector (106) to disconnect the positive power supply voltage (121) from, and connect the first predetermined voltage (125) to, the output line (115) of the positive voltage selector (121). In response to the control signal (116) transitioning from the first state (e.g., "1") to the second state (e.g., "0"), the second transition (e.g., at t4 in waveform 114 of FIG. 2 or 3) in the second selection input (114) causes the negative voltage selector (108) to disconnect the second predetermined voltage (123) from, and connect the negative power supply voltage (127) to, the output line (117) of the negative voltage selector (108).

At block 171, in response to the control signal on the input line (109) transitioning from the second state (e.g., "0") to the first state (e.g., "1"), the second selection input provided on the second output line (107) completes a third transition (e.g., t6 to t7 in waveform 114 in of FIG. 2 or 3) before the first selection input provided on the first output line (105) starts a fourth transition (e.g., t8 in waveform 112 of FIG. 2 or 3).

For example, in response to the control signal (116) transitioning from the second state (e.g., "0") to the first state (e.g., "1"), the third transition (e.g., between t6 and t7 in waveform 114 of FIG. 2 or 3) in the second selection input (114) causes the negative voltage selector (108) to connect the second predetermined voltage (123) to, and disconnect the negative power supply voltage (127) from, the output line (117) of the negative voltage selector (108). In response to the control signal (116) transitioning from the second state (e.g., "0") to the first state (e.g., "1"), the fourth transition (e.g., at t8 in waveform 112 of FIG. 2 or 3) in the first selection input (112) causes the positive voltage selector (106) to connect the positive power supply voltage (121) to, and disconnect the first predetermined voltage (125) from, the output line (115) of the positive voltage selector (106).

Thus, between the control signal (116) transitioning into the second state (e.g., "0") from the first state (e.g., "1") and the timing control circuit reaching a first steady state (e.g., illustrated in FIG. 5), the output line (115) of the positive voltage selector (108) is disconnected from the positive power supply voltage (121) before the output line (117) of the negative voltage selector (108) is connected to the negative power supply voltage (127).

Similarly, between the control signal (116) transitioning into the first state (e.g., "1") from the second state (e.g., "0") and the timing control circuit reaching a second steady state (e.g., illustrated in FIG. 4), the output line (117) of the negative voltage selector (108) is disconnected from the negative power supply voltage (127) before the output line (115) of the positive voltage selector (106) is connected to the positive power supply voltage (121).

For example, the positive power supply voltage (121) is 5V; the negative power supply voltage (127) is −4.5V; the first predetermined voltage (125) is 1.2V; and the second predetermined voltage (123) is 0V.

The arrangement of the sequential first and second transitions and the sequential third and fourth transitions ensures that the positive and negative power supply voltages (121 and 127) are not simultaneously applied to the output lines (115 and 117 of the positive and negative voltage selectors (106 and 108).

The first selection input (112) can be generated in the timing control circuit using an AND circuit, such as an AND gate (101) connected to a first voltage selector (102) (or a first delay (102) of FIG. 1). The AND gate (101) receives, as input, the control signal (116) and the second selection input (114) to generate an input for the first voltage selector (or delay) (102) to generate the first selection input (112).

The second selection input (114) can be generated in the timing control circuit using an OR circuit, such as an OR gate (103) connected to a second voltage selector (104) (or a second delay (104) of FIG. 1). The OR gate (103) receives, as input, the control signal (116) and the first selection input (112) to generate an input for the second voltage selector (or delay) (104) to generate the second selection input (114).

A third voltage selector (129) can connect a third output line (119) to the output line (115) of the positive voltage selector (106) or the output line (117) of the negative voltage selector (108), based on the second predetermined voltage (123) and voltage changes in the output line (115) of the positive voltage selector (106) and the output line (117) of the negative voltage selector (108).

When the control signal (116) is in the first state (e.g., "1") and the timing control circuit reaches the first steady state (e.g., illustrated in FIG. 4), the third output line (119) is connected to the positive power supply voltage (121) via the first and third voltage selectors (106 and 129). When the control signal (109) is in the second state (e.g., "0") and the timing control circuit reaches the second steady state (e.g., illustrated in FIG. 5), the third output line (119) is connected to the negative power supply voltage (127) via the second and third voltage selectors (108 and 129).

Figure 8:
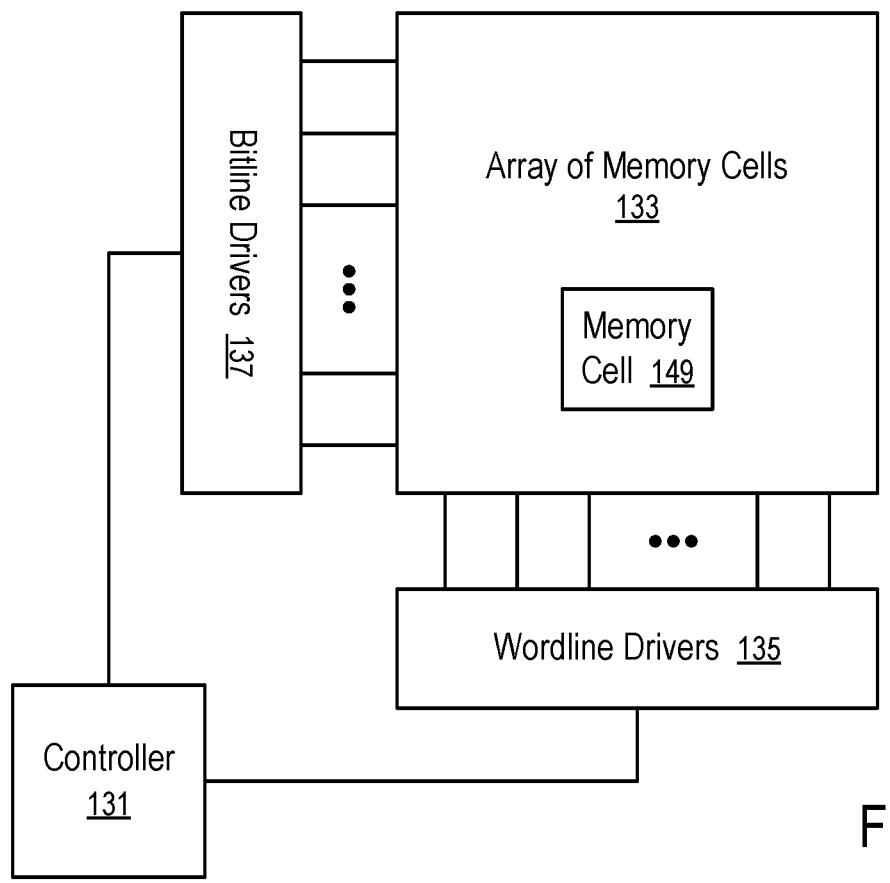
FIG. 8 shows a memory device configured with voltage timing control according to one embodiment.
Figure 9:
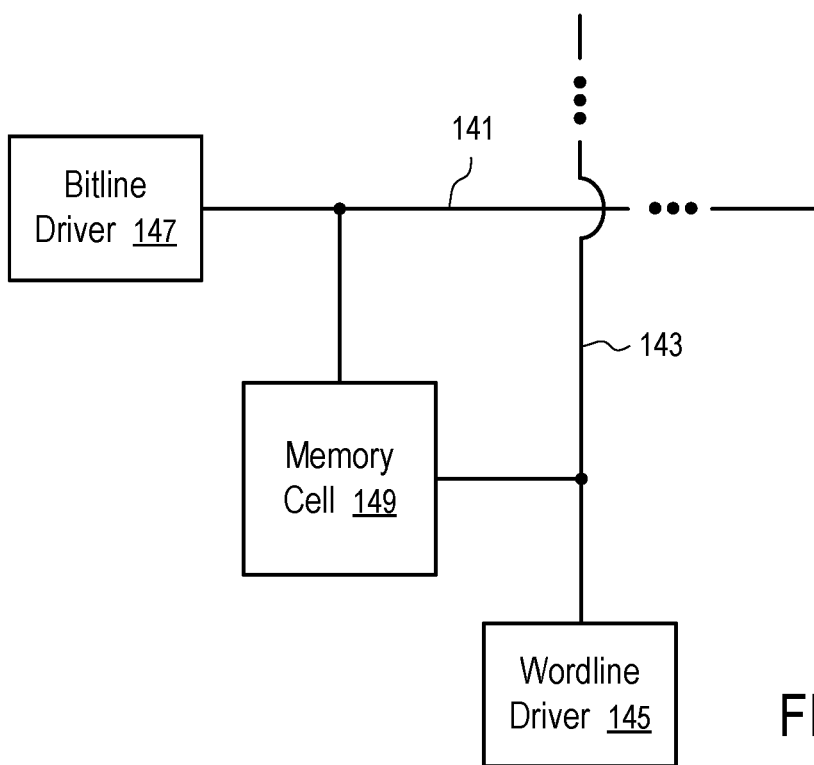
FIG. 9 shows a memory cell with a bitline driver and a wordline driver having voltage timing control according to one embodiment.

The voltage timing control can be used to provide voltages for a voltage driver of a memory cell in an integrated circuit memory device (e.g., illustrated in FIGS. 8 and 9). For example, the memory cell has a select device and no phase-change memory device; the memory cell is programmable to store data via applying pulses with opposite polarity; and during an operation to read the memory cell, voltages of a predetermined, fixed polarity are applied on the memory cell.

FIG. 8 shows a memory device configured with voltage timing control according to one embodiment.

In FIG. 8, the memory device includes an array (133) of memory cells.

The memory device of FIG. 8 includes a controller (131) that operates bitline drivers (137) and wordline drivers (135) to access the individual memory cells (e.g., 101) in the array (133).

The bitline drivers (137) and/or the wordline drivers (135) can have a timing control circuit of FIG. 1 or 3 for polarity transition.

Each memory cell (e.g., 149) in the array (133) can be accessed via voltages driven by a pair of a bitline driver and a wordline driver, as illustrated in FIG. 9.

FIG. 9 shows a memory cell with a bitline driver (147) and a wordline driver (145) having voltage timing control according to one embodiment.

For example, the bitline driver (147) drives on a wire (141) a first voltage applied to a row of memory cells in the array (133); and the wordline driver (145) drives one a wire (143) a second voltage applied to a column of memory cells in the array (133). A memory cell (149) in the row and column of the memory cell array (133) is subjected to the voltage difference between the first voltage driven by the bitline driver (147) and the second voltage driven by the wordline driver (145). When the first voltage is higher than the second voltage, the memory cell (149) is subjected to one voltage polarity (e.g., positive polarity); and when the first voltage is lower than the second voltage, the memory cell (149) is subjected to an opposite voltage polarity (e.g., negative polarity).

At least one of the bitline driver (147) and the wordline driver (145) can configured as a driver with voltages supplied via timing controlled in a way as illustrated in FIGS. 1-7.

For example, when the memory cell (149) is to be selected, the bitline driver (147) drives a positive high voltage (e.g., 4V) in one polarity and a negative high voltage (e.g., −4V) in the opposite polarity. Similarly, the wordline driver (145) drives a negative high voltage (e.g., −4V) in one polarity and a positive high voltage (e.g., 4V) in the opposite polarity.

For example, when the memory cell (149) is to be de-selected, the bitline driver (147) drives a low voltage (e.g., 0V) in one polarity and a low voltage (e.g., 0V) in the opposite polarity. When the bitline driver (147) drives a low voltage, the wordline driver (145) may drive a high voltage, or drive a low voltage.

Similarly, when the memory cell (149) is to be de-selected, the wordline driver (145) drives a low voltage (e.g., 0V) in one polarity and a low voltage (e.g., 0V) in the opposite polarity. When the wordline driver (145) drives a low voltage, the bitline driver (147) may drive a high voltage, or drive a low voltage.

For example, the bitline drivers (137) can be used to drive parallel wires (e.g., 141) arranged in one direction and disposed in one layer of cross point memory; and the wordline drivers (135) can be used to drive parallel wires (e.g., 143) arranged in another direction and disposed in another layer of the cross point memory. The wires (e.g., 141) connected to the bitline drivers (e.g., 147) and the wires (e.g., 143) connected to the wordline drivers (e.g., 145) run in the two layers in orthogonal directions. The memory cell array (133) is sandwiched between the two layers of wires; and a memory cell (e.g., 149) in the array (133) is formed at a cross point of the two wires (e.g., 141 and 143) in the integrated circuit die of the cross point memory.

The present disclosure includes methods and apparatuses which perform the methods described above, including data processing systems which perform these methods, and computer readable media containing instructions which when executed on data processing systems cause the systems to perform these methods.

The memory device of FIG. 8 can be used in a data processing system.

A typical data processing system may include an inter-connect (e.g., bus and system core logic), which interconnects a microprocessor(s) and memory. The microprocessor is typically coupled to cache memory.

The inter-connect interconnects the microprocessor(s) and the memory together and also interconnects them to input/output (I/O) device(s) via I/O controller(s). I/O devices may include a display device and/or peripheral devices, such as mice, keyboards, modems, network interfaces, printers, scanners, video cameras and other devices known in the art. In one embodiment, when the data processing system is a server system, some of the I/O devices, such as printers, scanners, mice, and/or keyboards, are optional.

The inter-connect can include one or more buses connected to one another through various bridges, controllers and/or adapters. In one embodiment the I/O controllers include a USB (Universal Serial Bus) adapter for controlling USB peripherals, and/or an IEEE-1394 bus adapter for controlling IEEE-1394 peripherals.

The memory may include one or more of: ROM (Read Only Memory), volatile RAM (Random Access Memory), and non-volatile memory, such as hard drive, flash memory, etc.

Volatile RAM is typically implemented as dynamic RAM (DRAM) which requires power continually in order to refresh or maintain the data in the memory. Non-volatile memory is typically a magnetic hard drive, a magnetic optical drive, an optical drive (e.g., a DVD RAM), or other type of memory system which maintains data even after power is removed from the system. The non-volatile memory may also be a random access memory.

The non-volatile memory can be a local device coupled directly to the rest of the components in the data processing system. A non-volatile memory that is remote from the system, such as a network storage device coupled to the data processing system through a network interface such as a modem or Ethernet interface, can also be used.

In the present disclosure, some functions and operations are described as being performed by or caused by software code to simplify description. However, such expressions are also used to specify that the functions result from execution of the code/instructions by a processor, such as a microprocessor.

Alternatively, or in combination, the functions and operations as described here can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

While one embodiment can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computer system or other data processing system in response to its processor, such as a microprocessor, executing sequences of instructions contained in a memory, such as ROM, volatile RAM, non-volatile memory, cache or a remote storage device.

Routines executed to implement the embodiments may be implemented as part of an operating system or a specific application, component, program, object, module or sequence of instructions referred to as "computer programs." The computer programs typically include one or more instructions set at various times in various memory and storage devices in a computer, and that, when read and executed by one or more processors in a computer, cause the computer to perform operations necessary to execute elements involving the various aspects.

A machine readable medium can be used to store software and data which when executed by a data processing system causes the system to perform various methods. The executable software and data may be stored in various places including for example ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a machine readable medium in entirety at a particular instance of time.

Examples of computer-readable media include but are not limited to non-transitory, recordable and non-recordable type media such as volatile and non-volatile memory devices, read only memory (ROM), random access memory (RAM), flash memory devices, floppy and other removable disks, magnetic disk storage media, optical storage media (e.g., Compact Disk Read-Only Memory (CD ROM), Digital Versatile Disks (DVDs), etc.), among others. The computer-readable media may store the instructions.

The instructions may also be embodied in digital and analog communication links for electrical, optical, acoustical or other forms of propagated signals, such as carrier waves, infrared signals, digital signals, etc. However, propagated signals, such as carrier waves, infrared signals, digital signals, etc. are not tangible machine readable medium and are not configured to store instructions.

In general, a machine readable medium includes any mechanism that provides (i.e., stores and/or transmits) information in a form accessible by a machine (e.g., a computer, network device, personal digital assistant, manufacturing tool, any device with a set of one or more processors, etc.).

In various embodiments, hardwired circuitry may be used in combination with software instructions to implement the techniques. Thus, the techniques are neither limited to any specific combination of hardware circuitry and software nor to any particular source for the instructions executed by the data processing system.

The above description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A voltage transitioning circuit in an integrated circuit memory device, the voltage transitioning circuit comprising:
    a timing control circuit having an input line, a first output line and a second output line, the input line configured to receive a control signal for the timing control circuit, the timing control circuit configured to generate, according to the control signal, a first selection input on the first output line and a second selection input on the second output line;
    a positive voltage selector having an output line and coupled to the first output line of the timing control circuit, the positive voltage selector configured to selectively connect, according to the first selection input, the output line of the positive voltage selector to a positive power supply voltage or a first predetermined voltage; and
    a negative voltage selector having an output line and coupled to the second output line of the timing control circuit, the negative voltage selector configured to selectively connect, according to the second selection input, the output line of the negative voltage selector to a second predetermined voltage or a negative power supply voltage;
    wherein the first selection input and the second selection input cause the positive voltage selector configured to connect the output line of the positive voltage selector to the first predetermined voltage before the negative voltage selector connects the output line of the negative voltage selector to the negative power supply voltage, when the control signal transitions from a first state to a second state; and
    wherein the first selection input and the second selection input cause the negative voltage selector connects the output line of the negative voltage selector to the second predetermined voltage before the positive voltage selector configured to connect the output line of the positive voltage selector to the positive power supply voltage, when the control signal transitions from the second state to the first state.

2. The voltage transitioning circuit of claim 1, wherein the timing control circuit comprises:
   an AND circuit configured to receive the control signal as input and generate the first selection input to the positive voltage selector; and
   an OR circuit configured to receive the control signal as input and generate the second selection input to the negative voltage selector;
   wherein the first selection input is connected to the OR circuit as input; and
   wherein the second selection input is connected to the AND circuit as input.

3. The voltage transitioning circuit of claim 2, wherein the AND circuit comprises:
   an AND gate to receive as input the control signal and the second selection input and generate a first output; and
   a first delay configured to generate the first selection input as a delayed version of the first output.

4. The voltage transitioning circuit of claim 3, wherein the OR circuit comprises:
   an OR gate to receive as input the control signal and the first selection input and generate a second output; and
   a second delay configured to generate the second selection input as a delayed version of the second output.

5. The voltage transitioning circuit of claim 4, wherein the negative power supply voltage is −4.5V; and the positive power supply voltage is 5V.

6. The voltage transitioning circuit of claim 5, wherein the first delay includes a first voltage selector configured to selectively connect, according to the first output, the first output line to the positive power supply voltage or the second predetermined voltage; and the second delay includes a second voltage selector configured to selectively connect, according to the second output, the second output line to the first predetermined voltage or the negative power supply voltage.

7. The voltage transitioning circuit of claim 6, wherein the first predetermined voltage is 1.2V; and the second predetermined voltage is 0V.

8. The voltage transitioning circuit of claim 7, further comprising:
   a third voltage selector having a third output line and configured to selectively connect, according to the second predetermined voltage as input, the third output line to the output line of the positive voltage selector or to the output line of the negative voltage selector.

9. The voltage transitioning circuit of claim 8, wherein the control signal is in the first state and the voltage transitioning circuit reaches a first steady state, the third output line is connected to the positive power supply voltage via the first and third voltage selectors; and when the control signal is in the second state and the voltage transitioning circuit reaches a second steady state, the third output line is connected to the negative power supply voltage via the second and third voltage selectors.

10. The voltage transitioning circuit of claim 9, wherein between the control signal transitioning from the first state into the second state and the timing control circuit reaching the second steady state, the output line of the positive voltage selector is disconnected from the positive power supply voltage before the output line of the negative voltage selector is connected to the negative power supply voltage.

11. The voltage transitioning circuit of claim 9, wherein between the control signal transitioning from the second state into the first state and the timing control circuit reaching the first steady state, the output line of the negative voltage selector is disconnected from the negative power supply voltage before the output line of the positive voltage selector is connected to the positive power supply voltage.

12. A method, comprising:
    connecting a control signal to an input line of a timing control circuit having a first output line and a second output line;
    generating, by the timing control circuit according to the control signal, a first selection input on the first output line and a second selection input on the second output line, wherein in response to the control signal transitioning from a first state to a second state, the first selection input completes a first transition before the second selection input starts a second transition, and wherein in response to the control signal transitioning from the second state to the first state, the second selection input completes a third transition before the first selection input starts a fourth transition;
    connecting, by a positive voltage selector having an output line and connected to the first output line of the timing control circuit, the output line of the positive voltage selector to a positive power supply voltage or a first predetermined voltage, according to the first selection input; and
    connecting, by a negative voltage selector having an output line and connected to the second output line of the timing control circuit, the output line of the negative voltage selector to a second predetermined voltage or a negative power supply voltage according to the second selection input.

13. The method of claim 12, wherein in response to the control signal transitioning from the first state to the second state,
    the first transition in the first selection input causes the positive voltage selector to disconnect the positive power supply voltage from, and connect the first predetermined voltage to, the output line of the positive voltage selector; and
    the second transition in the second selection input causes the negative voltage selector to disconnect the second predetermined voltage from, and
    connect the negative power supply voltage to, the output line of the negative voltage selector.

14. The method of claim 13, wherein in response to the control signal transitioning from the second state to the first state,
    the third transition in the second selection input causes the negative voltage selector to connect the second predetermined voltage to, and disconnect the negative power supply voltage from, the output line of the negative voltage selector;
    the fourth transition in the first selection input causes the positive voltage selector to connect the positive power supply voltage to, and disconnect the first predetermined voltage from, the output line of the positive voltage selector.

15. The method of claim 13, wherein the positive power supply voltage is 5V; the negative power supply voltage is −4.5V; and the positive and negative power supply voltages are not simultaneously applied to the output lines of the positive and negative voltage selectors.

16. The method of claim 14, wherein the first predetermined voltage is 1.2V; and the second predetermined voltage is 0V; and the method further comprises:
- generating, in the timing control circuit using an AND gate and a first voltage selector, the first selection input;
- generating, in the timing control circuit using an OR gate and a second voltage selector, the second selection input;
- receiving in the AND gate as input the control signal and the second selection input;
- receiving in the OR gate as input the control signal and the first selection input; and
- connecting, by a third voltage selector, a third output line to the output line of the positive voltage selector or the output line of the negative voltage selector, based on the second predetermined voltage and voltage changes in the output line of the positive voltage selector and the output line of the negative voltage selector.

17. A memory device, comprising:
- a controller;
- a first set of parallel wires disposed in a first layer of an integrated circuit die;
- a second set of parallel wires disposed in a second layer of the integrated circuit die;
- a first set of voltage drivers connected to the first set of parallel wires respectively;
- a second set of voltage drivers connected to the second set of parallel wires respectively; and
- an array of memory cells formed between the first layer and the second layer, wherein each respective memory cell is at a cross point of a wire in the first layer and a wire in the second layer;
- wherein each respective voltage driver in the first and second sets of voltage drivers has a timing control circuit for a voltage driver;
- wherein the timing control circuit has an input line, a first output line and a second output line, the input line configured to receive a control signal for the timing control circuit, the timing control circuit configured to generate, according to the control signal, a first selection input on the first output line and a second selection input on the second output line;
- wherein in response to the control signal transitioning from a first state to a second state, the first selection input completes a first transition before the second selection input starts a second transition; and
- wherein in response to the control signal transitioning from the second state to the first state, the second selection input completes a third transition before the first selection input starts a fourth transition.

18. The memory device of claim 17, wherein the timing control circuit comprises:
- an AND gate connected to receive, as input, the control signal and the second selection input, to generate a first output;
- a first voltage selector configured to generate the first selection input based on the first output;
- an OR gate connected to receive, as input, the control signal and the first selection input, to generate a second output; and
- a second voltage selector configured to generate the second selection input based on the second output.

19. The memory device of claim 18, wherein the voltage driver comprises:
- a positive voltage selector having an output line and connected to the first output line of the timing control circuit, the positive voltage selector configured to selectively connect the output line of the positive voltage selector to a positive power supply voltage or a first predetermined voltage, according to the first selection input; and
- a negative voltage selector having an output line and connected to the second output line of the timing control circuit, the negative voltage selector configured to selectively connect the output line of the negative voltage selector to a second predetermined voltage or a negative power supply voltage according to the second selection input.

20. The memory device of claim 19, wherein the positive power supply voltage is 5V; the negative power supply voltage is −4.5V; the first predetermined voltage is 1.2V; the second predetermined voltage is 0V; and the voltage driver further comprises:
- a third voltage selector configured to selectively connect a third output line to the output line of the positive voltage selection or the output line of the negative voltage selector, based on the second predetermined voltage and voltage changes in the output line of the positive voltage selection and the output line of the negative voltage selector.

* * * * *